US012787715B2

(12) United States Patent
Li et al.

(10) Patent No.: US 12,787,715 B2
(45) Date of Patent: Nov. 3, 2026

(54) WAFER MANUFACTURING SYSTEM AND METHOD FOR MANUFACTURING WAFERS

(71) Applicants: TAIWAN SEMICONDUCTOR MANUFACTURING COMPANY, LTD., Hsinchu (TW); TSMC China Company Limited, Shanghai (CN)

(72) Inventors: Xiaoguang Li, Shanghai City (CN); Yifei Zhang, Shanghai City (CN); Jinping Wu, Shanghai City (CN)

(73) Assignees: TAIWAN SEMICONDUCTOR MANUFACTURING COMPANY, LTD., Hsinchu (TW); TSMC CHINA COMPANY LIMITED, Shanghai (CN)

( * ) Notice: Subject to any disclaimer, the term of this patent is extended or adjusted under 35 U.S.C. 154(b) by 636 days.

(21) Appl. No.: 18/305,714

(22) Filed: Apr. 24, 2023

(65) Prior Publication Data

US 2024/0321648 A1 Sep. 26, 2024

(30) Foreign Application Priority Data

Mar. 22, 2023 (CN) ......................... 202310286056.7

(51) Int. Cl.

*H10P 74/20* (2026.01)
*G05B 19/4099* (2006.01)
*H10P 14/60* (2026.01)

(52) U.S. Cl.

CPC ........ *H10P 74/203* (2026.01); *G05B 19/4099* (2013.01); *H10P 14/6304* (2026.01); *G05B 2219/45031* (2013.01)

(58) Field of Classification Search

CPC . H01L 22/12; H01L 21/0223; G05B 19/4099; G05B 2219/45031
See application file for complete search history.

(56) References Cited

U.S. PATENT DOCUMENTS

2003/0094136 A1 * 5/2003 Bartholomew ..... C23C 16/4412 118/715
2005/0095800 A1 * 5/2005 Garza ................. H01J 37/3171 438/305
2018/0025904 A1 * 1/2018 DeKraker ......... H01L 21/67051 134/21

FOREIGN PATENT DOCUMENTS

CN 104751261 A * 7/2015

* cited by examiner

*Primary Examiner* — Mohammad M Choudhry
(74) *Attorney, Agent, or Firm* — Birch, Stewart, Kolasch & Birch, LLP

(57) ABSTRACT

A method for manufacturing wafers is provided, including: forming, according to a first control parameter, a first oxidation layer on each wafer of a first batch of wafers under a first atmospheric pressure; in response to receiving a process request corresponding to a second batch of wafers: detecting a second atmospheric pressure in the process tube; determining an atmospheric pressure change between the second atmospheric pressure and the first atmospheric pressure; selecting, according to a corresponding ratio of each of multiple process recipes, an acceptable process recipe among the process recipes; determining a thickness difference between the second thickness and the first thickness; generating a second control parameter according to the atmospheric pressure change, the thickness difference, and the first control parameter; and forming a second oxidation layer on each wafer of the second batch of wafers under the second pressure according to the second control parameter.

20 Claims, 5 Drawing Sheets

400

WAFER MANUFACTURING SYSTEM AND METHOD FOR MANUFACTURING WAFERS

CROSS REFERENCE

The present application claims priority to China Application Serial Number 202310286056.7 filed on Mar. 22, 2023, which is herein incorporated by reference in its entirety.

BACKGROUND

In semiconductor device fabrication, a furnace is used to form oxidation layers on wafers. To do so, gases such as oxygen and/or hydrogen are transmitted into a process tube of the furnace, and the process tube is heated. However, the air pressure in the tube changes according to outer environment and thus greatly impacts the thickness of the oxidation layers formed on the wafers. Because the thickness of oxidation layer determines the characteristics of a semiconductor device, the fluctuation of air pressure endangers the performance and reliability of manufactured device.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
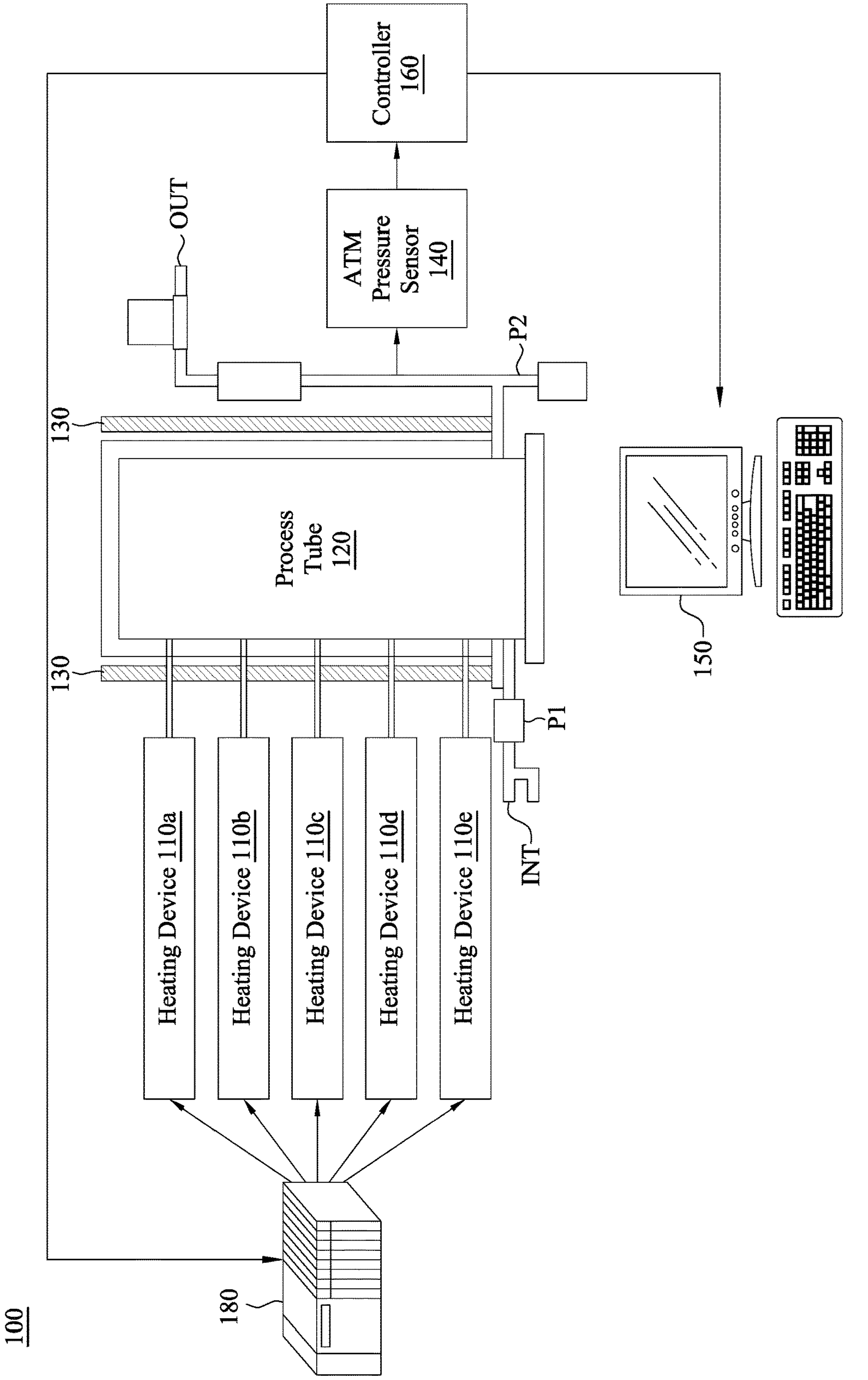
FIG. 1 is a schematic diagram of a wafer manufacturing system, in accordance with some embodiments of the present disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

The terms used in this specification generally have their ordinary meanings in the art and in the specific context where each term is used. The use of examples in this specification, including examples of any terms discussed herein, is illustrative only, and in no way limits the scope and meaning of the disclosure or of any exemplified term. Likewise, the present disclosure is not limited to various embodiments given in this specification.

As used herein, the terms "comprising," "including," "having," "containing," "involving," and the like are to be understood to be open-ended, i.e., to mean including but not limited to.

Reference throughout the specification to "one embodiment," "an embodiment," or "some embodiments" means that a particular feature, structure, implementation, or characteristic described in connection with the embodiment (s) is included in at least one embodiment of the present disclosure. Thus, uses of the phrases "in one embodiment" or "in an embodiment" or "in some embodiments" in various places throughout the specification are not necessarily all referring to the same embodiment. Furthermore, the particular features, structures, implementation, or characteristics may be combined in any suitable manner in one or more embodiments.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly. As used herein, the term "and/or" includes any and all combinations of one or more of the associated listed items.

As used herein, "around", "about", "approximately" or "substantially" shall generally refer to any approximate value of a given value or range, in which it is varied depending on various arts in which it pertains, and the scope of which should be accorded with the broadest interpretation understood by the person skilled in the art to which it pertains, so as to encompass all such modifications and similar structures. In some embodiments, it shall generally mean within 20 percent, preferably within 10 percent, and more preferably within 5 percent of a given value or range. Numerical quantities given herein are approximate, meaning that the term "around", "about", "approximately" or "substantially" can be inferred if not expressly stated, or meaning other approximate values.

Reference is now made to FIG. 1. FIG. 1 is a schematic diagram of a wafer manufacturing system 100, in accordance with some embodiments of the present disclosure. For illustration, the wafer manufacturing system 100 includes heating devices 110*a*-110*e*, a process tube 120, an atmospheric (ATM) pressure sensor 140, a controller 160, and a temperature controller 180.

Figure 2:
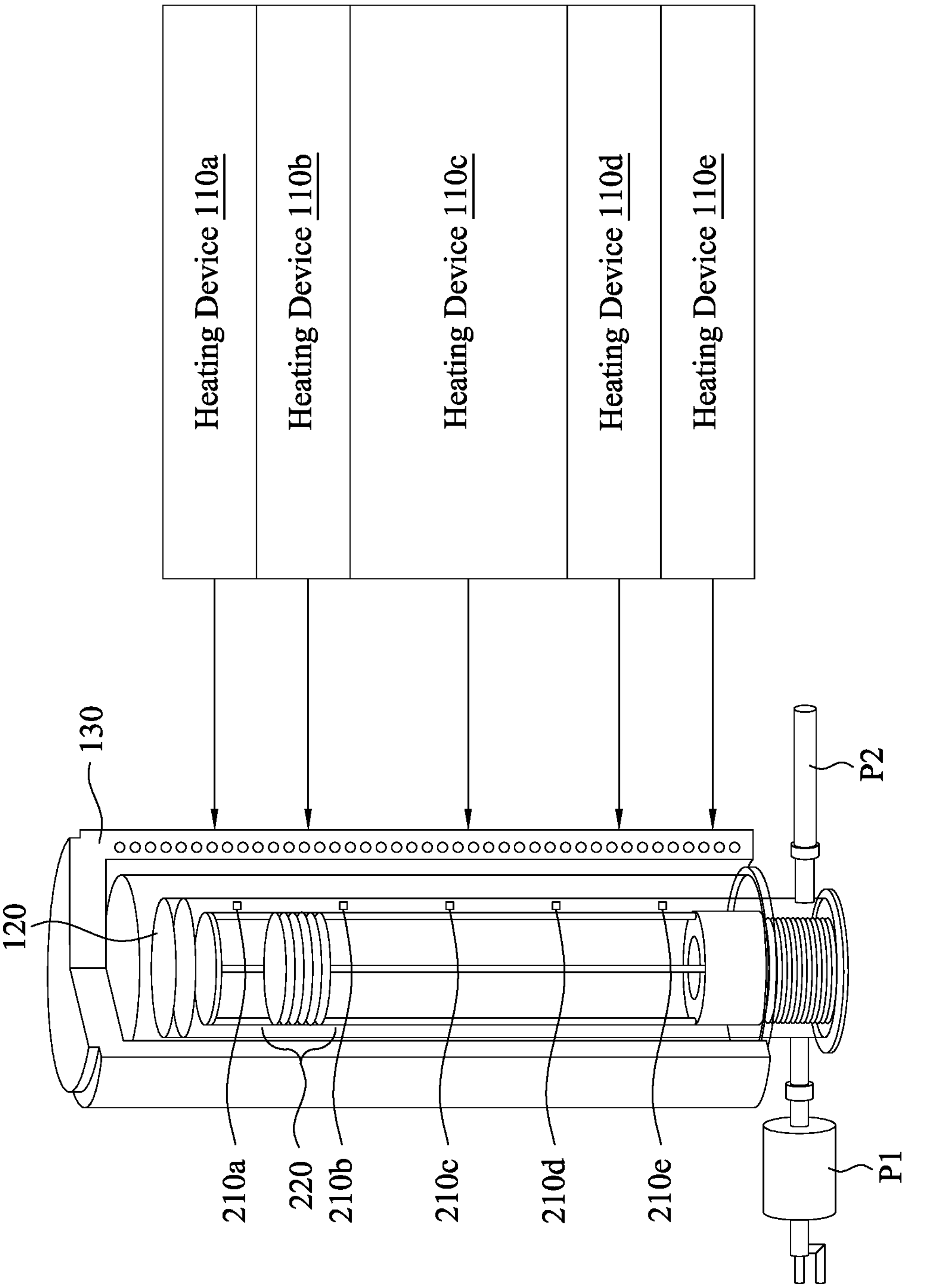
FIG. 2 is a schematic diagram of a part of the wafer manufacturing system shown in FIG. 1, in accordance with some embodiments of the present disclosure.

For illustration of FIG. 1, the process tube 120 is configured to arrange and accommodate multiple wafers (such as the wafers 220 shown in FIG. 2). In some embodiments, 150 pieces of wafers are arranged in the process tube 120. In some embodiments, 150 pieces of wafers are referred to as one batch of wafers. One batch of wafers will be processed by the wafer manufacturing system 100 at the same time, and when the batch of wafers have gone through the processing, the batch of wafers will be removed from the process tube 120, and a next batch of wafers will be placed into the process tube 120.

For illustration of FIG. 1, the process tube 120 is connected to pipelines P1-P2, the pipeline P1 has an intake INT, and the pipeline P2 has an outtake OUT. The pipeline P1 is configured for gases such as oxygen, hydrogen, etc. to be transmitted into the process tube 120 through the intake INT, so that the gases are able to facilitate the oxidation and the forming of oxidation layers of the wafers in the process tube 120. The pipeline P2 is configured for the gases to flow out of the process tube 120 and to be expelled through the outtake OUT.

For illustration of FIG. 1, the heating devices 110*a*-110*e* are configured to heat the process tube 120 to a certain temperature. In some embodiments, the heating devices 110*a*-110*e* are configured to heat the process tube 120 through a resistive coil 130. For illustration, the resistive coil 130 is arranged to surround the process tube 120. In some embodiments, the resistive coil 130 is a coil made of conductive materials with enough resistance, such as nickel alloy or other alloy material, and is configured to generate heat when receiving currents from the heating devices 110*a*-110*e*.

For illustration, the heating devices 110*a*-110*e* are connected to corresponding parts of the resistive coil 130. When each of the heating devices 110*a*-110*e* transmits a current from the temperature controller 180 to a corresponding part of the resistive coil 130, the corresponding part of the resistive coil 130 generates heat according to the received current. Accordingly, the heating devices 110*a*-110*e* are able to heat the process tube 120 by providing currents to resistive coil 130.

In some embodiments, the heating devices 110*a*-110*e* are thermal couples that are able to provide currents to the corresponding parts of the resistive coil 130 and to detect the temperatures of the corresponding parts of the resistive coil 130.

For illustration of FIG. 1, five heating devices 110*a*-110*e* are used in the wafer manufacturing system 100 in order to better control the temperature of the process tube 120. In various embodiments, different numbers of heating devices are used to control the temperature of the process tube 120.

Please refer to FIG. 2. FIG. 2 is a schematic diagram of a part of the wafer manufacturing system 100 shown in FIG. 1, in accordance with some embodiments of the present disclosure. For illustration of FIG. 2, multiple wafers 220 are arranged in the process tube 120, the resistive coil 130 surrounds the process tube 120, and the heating devices 110*a*-110*e* are connected to parts of the resistive coil 130.

In some embodiments, as shown in FIG. 2, the heating device 110*c* corresponds to a larger part of the resistive coil 130, compared with the heating device 110*a*, 110*b*, 110*d*, and 110*e*. Alternatively stated, the part of the resistive coil 130 that is connected to the heating device 110*c* is larger than the parts of the resistive coil 130 that are connected to the heating device 110*a*, 110*b*, 110*d*, and 110*e*. In some embodiments, it is harder to control and maintain the temperature of the top and bottom ends of the process tube 120, so more heating devices are required to connect to the parts of the resistive coil 130 that correspond to the top and bottom ends of the process tube 120. For example, the heating devices 110*a*-110*b* are configured to control the temperature of the top end of the process tube 120, and the heating devices 110*d*-110*e* are configured to control the temperature of the bottom end of the process tube 120. On the other hand, it is easier to control and maintain the temperature of the middle part of the process tube 120, so only one heating device 110*c* is required to connect to the part of the resistive coil 130 that correspond to the middle part of the process tube 120. Thus, the heating device 110*c* corresponds to a larger part of the resistive coil 130 and the process tube 120, as illustrated in FIG. 2.

In some embodiments, as shown in FIG. 2, the wafer manufacturing system 100 further includes thickness monitors 210*a*-210*e* arranged in the process tube 120. Each of the thickness monitors 210*a*-210*e* is configured to detect the thicknesses of oxidation layers of the wafers nearby. For example, in the embodiments where 150 wafers are arranged in the process tube 120, the thickness monitor 210*a* is configured to detect the thicknesses of oxidation layers of the 30 wafers arranged at the top, the thickness monitor 210*b* is configured to detect the thicknesses of oxidation layers of the 30 wafers arranged close to the thickness monitor 210*b*, and so on.

For simplicity of illustration, FIG. 2 merely illustrates six wafers 220. In some embodiments, 150 wafers 220 are arranged in the process tube 120 at the same time. In various embodiments, different numbers of wafers are arranged in the process tube 120 at the same time according to specification of the process tube 120 and/or actual need of device manufacturer.

Figure 3:
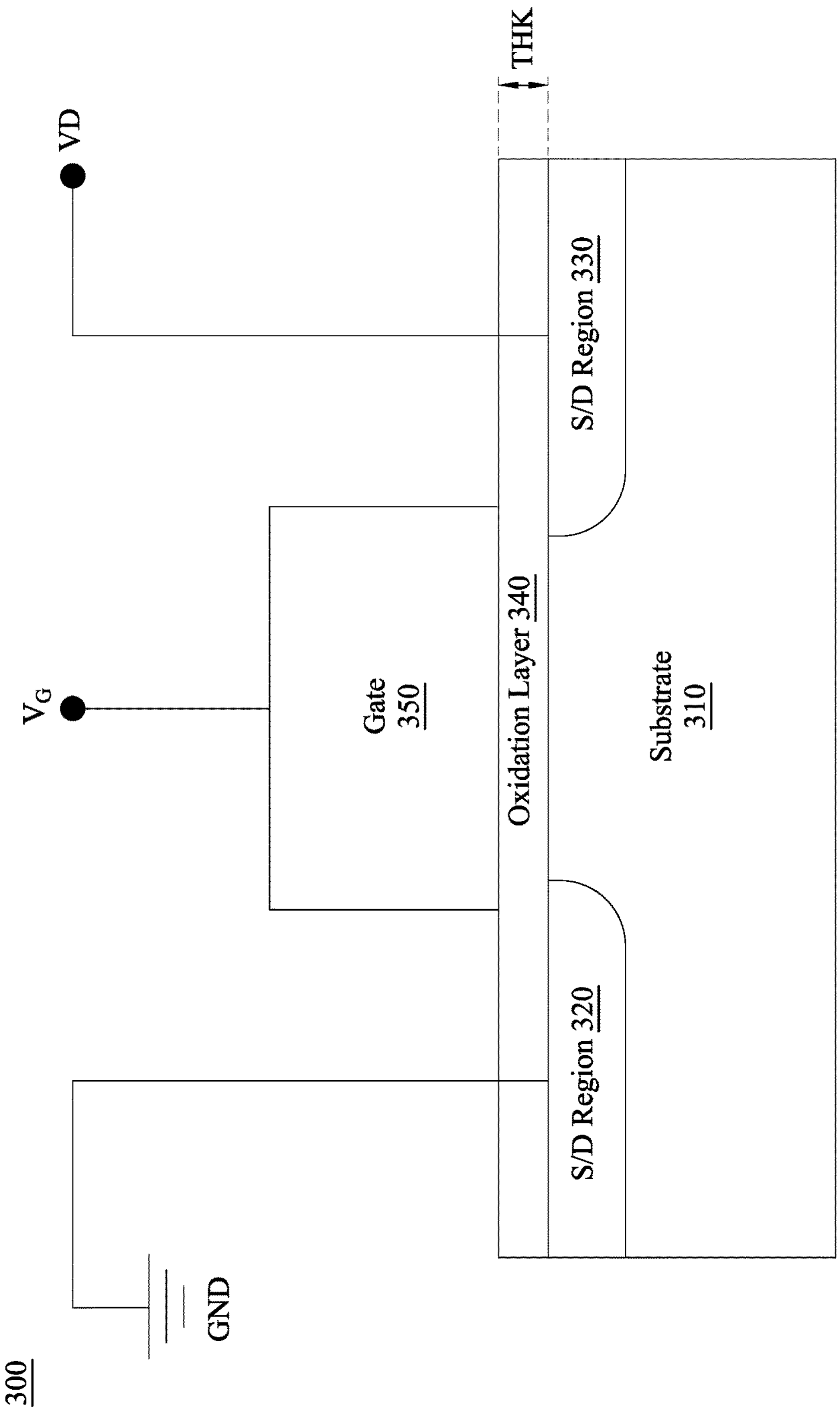
FIG. 3 is a cross-sectional diagram of a semiconductor device, in accordance with some embodiments of the present disclosure.

Please refer to FIG. 3. FIG. 3 is a cross-sectional diagram of a semiconductor device 300, in accordance with some embodiments of the present disclosure. In some embodiments, each of the wafers arranged in the process tube 120, such as the wafers 220 shown in FIG. 2, includes multiple semiconductor devices, such as the semiconductor device 300 as shown in FIG. 3. The process tube 120 shown in FIGS. 1-2 is configured to manufacture the oxidation layer 340 of the semiconductor device 300.

In some embodiments, the semiconductor device 300 includes a transistor, the channel of the transistor is formed in the substrate 310, the S/D regions 320-330 are configured as the source and drain terminals of the transistor, and the gate 305 is configured as the gate terminal of the transistor.

For illustration, as shown in FIG. 3, the oxidation layer 340 is arranged between a gate 350 and a substrate 310. When the gate 350 receives a voltage VG, a channel is formed in the substrate 310 and between the source/drain (S/D) regions 320 and 330, so that a current will flow from the S/D region 330 receiving a positive voltage VD to the S/D region 320 receiving a ground voltage GND, and the semiconductor device 300 is configured as a metal-oxide-semiconductor (MOS) transistor and is turned on. In some embodiments, the oxidation layer 340 is referred to as a gate oxide layer.

The configurations of FIG. 3 are given for illustrative purposes. Various implements are within the contemplated scope of the present disclosure. For example, in some embodiments, the process tube 120 is configured to form oxidation layers different from gate oxide layers on the wafers arranged in the process tube 120.

In some embodiments, the wafer manufacturing system 100 illustrated in FIG. 1 is configured to form the oxidation layer 340 as shown in FIG. 3. The substrate 310 corresponds to the wafers arranged in the process tube 120. When certain gases are provided and certain temperature is met, the oxidation of the substrate 3100 happens, and the oxidation layer 340 forms on the substrate 310.

For illustration of FIG. 3, the oxidation layer 340 has a thickness THK. In some embodiments, the thickness THK of the oxidation layer 340 substantially determines the electrical properties of the semiconductor device 300. One purpose of the wafer manufacturing system 100 is to ensure that the thickness THK of the oxidation layer 340 meets a target thickness according to a process recipe. Details of target thickness and process recipe will be discussed in later paragraphs and through Table 1 below.

Please refer to FIG. 1 again. For illustration of FIG. 1, the temperature controller 180 is electrically connected to the heating devices 110*a*-110*e* and configured to control, according to multiple control parameters, the temperature of the process tube 120 through the heating devices 110*a*-110*e*. In some embodiments, the temperature controller 180 determines the current that each of the heating devices 110*a*-110*e* provides to its corresponding part of the resistive coil 130 according to the control parameters received from the controller 160.

In some embodiments, one or more of the host computer 150, the controller 160, and the temperature controller 180, includes a central processing unit (CPU), a microcontroller unit (MCU), and/or a graphic processing unit (GPU).

For illustration of FIG. 1, the ATM pressure sensor 140 is connected to the process tube 120 through the pipeline P2 and configured to detect an ATM pressure change in the process tube 120. Since the pipeline P2 is connected to the process tube 120, the ATM pressure in the pipeline P2 is the same as the ATM pressure in the process tube 120. Thus, by detecting the ATM pressure change in the pipeline P2, the ATM pressure sensor 140 is able to detect the ATM pressure change in the process tube 120.

In some embodiments, the ATM pressure sensor 140 is configured to continuously monitor the ATM pressure in the process tube 120 and transmit the monitored ATM pressure to the controller 160. In various embodiments, the ATM pressure sensor 140 is configured to detect the ATM pressure in the process tube 120 when receiving a command from the controller 160 and to transmit the detected ATM pressure to the controller 160.

For illustration of FIG. 1, the controller 160 is electrically connected to the ATM pressure sensor 140 and the temperature controller 180. The controller 160 is configured to generate the control parameters and send the control parameters to the temperature controller 180, so that the temperature controller 180 is able to control the temperature of the process tube 120 through the heating devices 110*a*-110*e* according to the control parameters.

In some embodiments, one of the control parameters generated by the controller 160 corresponds to the temperatures to which the heating devices 110*a*-110*e* heat different parts of the process tube 120, and another one of the control parameters corresponds to parameters other than temperatures, such as time durations during which the heating devices 110*a*-110*e* different parts of heat the process tube 120. In some embodiments, the controller 160 is configured to generate one of the control parameters according to the ATM change that the ATM pressure sensor 140 detects. Details regarding the generation of the control parameter will be discussed in later paragraphs.

For illustration of FIG. 1, in some embodiments, the wafer manufacturing system 100 further includes a host computer 150. The host computer 150 is configured to store information about the wafers, semiconductor devices to be made from the wafers, process recipes configured to manufacture the semiconductor devices, and/or other information.

In some embodiments, the wafer manufacturing system 100 includes other tools, devices, and/or equipment to implement the processing of the wafers, such as tools configured to place the wafers inside the process tube 120 and to move the wafers out of the process tube 120 when the processing is done. The host computer 150 is configured to give commands to these tools. For example, the host computer 150 is able to command the tools to complete the process of a batch wafer and to start another batch of wafer into the process tube 120. In some embodiments, the host computer 150 is referred to as a tool host.

In some embodiments, the wafer manufacturing system 100 is configured to form oxidation layers on the wafers according to various process recipes. Each process recipe includes information regarding oxidation condition under which the wafers are processed, target thickness of oxidation layers to be formed on the wafers, and so on. Table 1 below shows exemplary process recipes. In some embodiments, in Table 1, the information corresponding to the same row indicates one process recipe.

TABLE 1

| Oxidation Condition | Target Thickness (A) | Factor value (A/kPa) | Pressure Adaptation Value |
|---|---|---|---|
| $O_2 + Si \rightarrow SiO_2$ | <50 | 0.35~0.45 | 60~85 |
| | 50~120 | 0.75~1.1 | 45~160 |
| | 100~200 | 1.0~1.5 | 70~200 |
| $H_2 + O_2 + Si \rightarrow SiO_2 + H_2$ | <20 | 0.1~0.15 | 63~101 |
| | 20~30 | 0.15~0.2 | 86~167 |
| | 30~50 | 0.3~0.35 | 101~203 |
| | 50~100 | 0.5~0.8 | 83~202 |
| | 100~150 | 0.8~1.5 | 107~188 |
| | 200~400 | 2.0~4.0 | 103~198 |
| | 500~1000 | 6.0~8.0 | 163~267 |

In some embodiments, as shown in Table 1, oxidation layers are formed under different oxidation condition. For example, under a first oxidation condition shown in Table 1, oxygen ($O_2$) is transmitted through the pipeline P1 into the process tube 120 for the forming of oxidation layers. As another example, under a second oxidation condition shown in Table 1, hydrogen ($H_2$) and oxygen ($O_2$) are transmitted through the pipeline P1 into the process tube 120 for the forming of oxidation layers.

In some embodiments, as shown in Table 1, each process recipe entails a target thickness of oxidation layer. Alternatively stated, each process recipe requires the oxidation layers formed on the wafers to have a specific thickness. For example, as shown in Table 1, under the first oxidation condition, one process recipe has a target thickness less than 50 angstrom (A), another has a target thickness of 50~120 A, and the other has a target thickness of 100~200. The target thicknesses corresponding to the process recipes to be performed under the second oxidation condition are also shown in Table 1.

In some embodiments, information regarding process recipes is stored in the host computer 150 and/or the controller 160 shown in FIG. 1. When the wafer manufacturing system 100 is going to process wafers according to a process recipe, such information of process recipes will be accessed, and the host computer 150 will instruct tools (not shown in FIG. 1) to release specific gases defined by the process recipe into the process tube 120 to meet the oxidation condition. The controller 160 is then configured to generate control parameters according to the target thickness corresponding to the process recipe and then send the control parameters to the temperature controller 180.

Table 1 and the information within are given for illustrative purposes. Various process recipes and their oxidation conditions and target thicknesses are within the contemplated scope of the present disclosure. For example, in various embodiments, process recipes entail oxidation conditions and target thicknesses different from the ones shown in Table 1.

As shown in Table 1, process recipes include other information, such as factor values and pressure adaptation values. The factor values are thickness changes that are associated with the ATM pressure change and correspond to the process recipes. For example, as shown in Table 1, the process recipe having the target thickness less than 50 A has a factor value of 0.35~0.45 A/kPa. Such factor value indicates that, when the ATM pressure change inside the process tube 120 increases 1000 Pascal (Pa) (1000 Pa=1 kPa), the oxidation layer formed according to the process recipe will have a thickness that is greater than the target thickness of that process recipe, and the increase of thickness is between 0.35 A and 0.45 A. Alternatively stated, the factor values reflect the levels to which the ATM pressure change affects the thicknesses of oxidation layers corresponding to the process recipes. The larger the factor value, the greater the thickness change of the oxidation layer.

As shown in Table 1, each process recipe has a corresponding factor value. In some embodiments, the factor values are obtained through experiments.

In some embodiments, the pressure adaptation values represent the adaptabilities of the process recipes to the ATM pressure change. The higher the pressure adaptation value, the better the ability of the process recipe to adapt ATM pressure change. Below shows the formula for the pressure adaptation value:

$$\text{Pressure Adaptation Value} = \frac{\text{Target Thickness}}{\text{Factor Value}} \times K_1$$

In some embodiments, $K_1$ in the above formula is a constant, such as 1, 0.9, or 0.8. In some embodiments, $K_1$ depends on the process that is being performed and the parameters of such process.

In some embodiments, the controller 160 is configured to determine the pressure adaptation values corresponding to the process recipes according to the target thicknesses and the factor values, by using the formula discussed above.

As shown in Table 1, each of the process recipes corresponds to a pressure adaptation value. In some embodiments, the pressure adaptation value corresponding to each process recipe is configured for the controller 160 to determine whether the process recipe is acceptable to be processed or run, according to the ATM pressure change detected by the ATM pressure sensor 140. Below shows the criteria for a process recipe to be acceptable:

$$\frac{\text{ATM Pressure Change}}{\text{Pressure Adaptation Value} \times B} < K_2$$

As the criteria above shows, when the ratio of the ATM pressure change to the product of the pressure adaptation value of a process recipe and a value B is less than a constant $K_2$, that process recipe is determined to be an acceptable process recipe.

In some embodiments, B is a thickness tolerance value and is a constant that depends on the process that is being performed and the parameters of such process. Alternatively stated, B is a deviation from the target thickness of a process recipe that is tolerable or acceptable for the process. For example, considering a process recipe having a target thickness of 50 A, if the B is 0.1 according to the process, it means that a resulting thickness between 49.9 and 50.1 A is acceptable for the process. As another example, still considering a process recipe having a target thickness of 50 A, if B is 0.5 according to the process, it means that a resulting thickness between 49.5 and 50.5 A is acceptable for the process. In some embodiments, B is referred to as the thickness window of the process recipe.

In some embodiments, $K_2$ in the above criteria is a constant, such as 0.5, 1, or other number. In some embodiments, $K_2$ depends on the process that is being performed and the parameters of such process, and the value indicates how strict the criteria of acceptable process recipe are. The less the value, the stricter the criteria are.

In some embodiments, the controller 160 shown in FIG. 1 is configured to select the acceptable process recipe among multiple process recipes according to the ATM pressure change and the pressure adaptation value corresponding to each of the process recipes, by using the criteria shown above.

For example, two process recipes are considered by the controller 160, one of the process recipes has a pressure adaptation value of 100, and the other has a pressure adaptation value of 250. Assuming that the ATM pressure change is detected to be 10 kPa, B is set to be 0.1, and $K_2$ is set to be 0.5, the ratio of the ATM pressure change to the product of the pressure adaptation value of the first process recipe and B is $$\frac{10}{100 \times 0.1} = 1,$$

and the ratio of the ATM pressure change to the product of the pressure adaptation value of the second process recipe and B $$\frac{10}{250 \times 0.1} = 0.4.$$

The ratio corresponding to the first process recipe (1) is larger than $K_2$ (0.5) and thus is not an acceptable process recipe. The ratio corresponding to the second process recipe (0.4) is less than $K_2$ (0.5) and thus is an acceptable process recipe. Therefore, the controller 160 is configured to select the second process recipe as the acceptable process recipe among the two process recipes according to the ATM pressure change and the pressure adaptation values of the process recipes, based on the criteria shown above.

In some embodiments, B in the criteria is set to be 1 and can be removed from the criteria. The criteria are then simplified to be whether the ratio of the ATM pressure change to the pressure adaptation value of a process recipe is less than $K_2$, and thus the controller 160 is configured to select an acceptable process recipe among the process recipes according to the ATM pressure change and the pressure adaptation values. The ratio of the ATM pressure change to the pressure adaptation value of the acceptable process recipe will be less than the constant $K_2$.

Therefore, the acceptable process recipe is selected and determined by the controller 160 according to the criteria shown above.

In some embodiments, after selecting the acceptable process recipe, the controller 160 is then configured to generate a control parameter according to the selected acceptable process recipe and the ATM pressure change for the wafer manufacturing system 100 to process the acceptable process recipe.

In some embodiments, before processing the acceptable process recipe, the wafer manufacturing system 100 has processed another process recipe. Such process recipe is referred to as the last process recipe, the target thickness corresponding the last process recipe is referred to as the last target thickness, and the control parameter configured to process the last process recipe is referred to as the last control parameter.

Comparing the last process recipe that has been performed and the acceptable process recipe that is going to be performed, a thickness difference exists between the last target thickness and the target thickness of the acceptable process recipe. In some embodiments, the controller 160 is configured to change the control parameter and generate a control parameter change, so that such thickness difference in the target thicknesses can be achieved.

In some embodiments, both the ATM pressure change in the process tube 120 and the control parameter change determined by the controller 160 will contribute to the thickness difference discussed above. The thickness difference can be determined through the formula below:

$$\begin{aligned}\Delta\text{Thickness} &= \text{Target Thickness} - \text{Last Thickness}\\ &= \Delta\text{Thickness}_{ATM} + \Delta\text{Thickness}_{Control\ Parameter}\end{aligned}$$

In the formula above, the thickness difference is denoted as ΔThickness, the last target thickness is denoted as Last Thickness, the contribution to thickness difference due to the ATM pressure change is denoted as $\Delta\text{Thickness}_{ATM}$, and the contribution to thickness difference due to the control parameter change determined by the controller 160 is denoted as $\Delta\text{Thickness}_{Control\ Parameter}$.

As the formula above shows, thickness difference is equal to the target thickness of the acceptable process recipe minus the last target thickness of the last process recipe and is also equal to the contribution to thickness difference due to the ATM pressure change plus the contribution to thickness difference due to the control parameter change.

In some embodiments, the contribution to thickness difference due to the ATM pressure change is equal to the product of the ATM pressure change and the factor value discussed in previous embodiments, as the factor value is the thickness change that is associated with the ATM pressure change. The contribution to thickness difference due to the ATM pressure change can be determined through the formula below:

$$\Delta\text{Thickness}_{ATM} = \text{ATM Pressure Change} \times \text{Factor Value}$$

In some embodiments, the control parameter change can be determined by the thickness change and a matrix, as shown in the formula below:

$$\Delta\text{Control Parameter} = \Delta\text{Thickness} \times [\text{Matrix}]$$

In some embodiments, the control parameter change can be obtained through the calculation below:

$$\begin{bmatrix} a_1 & b_1 & c_1 & d_1 & e_1 & f_1 \\ a_2 & b_2 & c_2 & d_2 & e_2 & f_2 \\ a_3 & b_3 & c_3 & d_3 & e_3 & f_3 \\ a_4 & b_4 & c_4 & d_4 & e_4 & f_4 \\ a_5 & b_5 & c_5 & d_5 & e_5 & f_5 \end{bmatrix} \times \begin{bmatrix} \Delta\text{Control Parameter 1} \\ \Delta\text{Control Parameter 2} \\ \Delta\text{Control Parameter 3} \\ \Delta\text{Control Parameter 4} \\ \Delta\text{Control Parameter 5} \\ \Delta\text{ATM Pressure} \end{bmatrix} = \begin{bmatrix} \Delta\text{Thickness 1} \\ \Delta\text{Thickness 2} \\ \Delta\text{Thickness 3} \\ \Delta\text{Thickness 4} \\ \Delta\text{Thickness 5} \end{bmatrix}$$

For illustration of FIG. 2, there are five heating devices 110*a*-110*e* configured to heat the process tube 120, and thus there will be five control parameter changes in order to process the acceptable process recipe. The five control parameter changes are denoted as ΔControl Parameter 1-ΔControl Parameter 5 in the calculation above. Since the process tube 120 is heated by the five heating devices 110*a*-110*e* at the same time, each of the five heating devices 110*a*-110*e* will contribute to the thickness change of wafers arranged in the process tube 120. Moreover, each of the five heating devices 110*a*-110*e* will have different thickness contribution to the wafers located in different positions of the process tube 120. For example, in some embodiments, the heating device 110*a* has a relatively large contribution to thickness change for the wafers arranged adjacent to the thickness monitor 210*a* because the heating device 110*a* is relatively close to the wafers arranged adjacent to the thickness monitor 210*a*; on the other hand, the heating device 110*a* has a relatively small contribution to thickness change for the wafers arranged adjacent to the thickness monitor 210*e* because the heating device 110*a* is relatively far from the wafers arranged adjacent to the thickness monitor 210*e*. Accordingly, the different contributions to the thickness changes of wafers arranged in different positions that are made by the five heating devices 110*a*-110*e* have to be considered in determining the control parameter changes.

In some embodiments, there will be five control parameter changes corresponding to the heating devices 110*a*-110*e* in order to process the acceptable process recipe. In the calculation above, ΔControl Parameter 1 corresponds to the required control parameter change for the heating device 110*a*, ΔControl Parameter 2 corresponds to the required control parameter change for the heating device 110*b*, ΔControl Parameter 3 corresponds to the required control parameter change for the heating device 110*c*, and so on.

In addition, $a_1$-$a_5$ correspond to the heating device 110*a*, $b_1$-$b_5$ correspond to the heating device 110*b*, $c_1$-$c_5$ correspond to the heating device 110*c*, and so on. Specifically, $a_1$ reflects how the control parameter change of the heating device 110*a* will contribute to the thickness changes of the wafers arranged adjacent to the thickness monitor 210*a*, $a_2$ reflects how the control parameter change of the heating device 110*b* will contribute to the thickness changes of the wafers arranged adjacent to the thickness monitor 210*b*, $a_3$ reflects how the control parameter change of the heating device 110*c* will contribute to the thickness changes of the wafers arranged adjacent to the thickness monitor 210*c* in the process tube 120, and so on.

Similarly, $b_1$ reflects how the control parameter change of the heating device 110*b* will contribute to the thickness changes of the wafers arranged adjacent to the thickness monitor 210*a*, $b_2$ reflects how the control parameter change of the heating device 110*b* will contribute to the thickness changes of the wafers arranged adjacent to the thickness monitor 210*b*, and so on. $c_1$ reflects how the control parameter change of the heating device 110*c* will contribute to the thickness changes of the wafers arranged adjacent to the thickness monitor 210*a*, $c_2$ reflects how the control parameter change of the heating device 110*c* will contribute to the thickness changes of the wafers arranged adjacent to the thickness monitor 210*b*0, and so on and so forth. In some embodiments, $a_1$-$a_5$, $b_1$-$b_5$, $c_1$-$c_5$, $d_1$-$d_5$, and $e_1$-$e_5$ are obtained through experiments.

In some embodiments, $f_1$-$f_5$ are the factor values corresponding to the wafers arranged in the five locations of the process tube 120. Alternatively stated, the ATM pressure change in the process tube 120 (denoted as ΔATM Pressure in the calculation above) has different impacts on the thicknesses of oxidation layers of wafers arranged in different positions of the process tube 120. Thus, the respective products of $f_1$-$f_5$ and the ATM pressure change indicate the contributions to thickness difference corresponding to wafers arranged respectively adjacent to the thickness monitors 210*a*-210*e* due to the ATM pressure change. Specifically, $f_1$ is the contribution to thickness difference corresponding to the wafers arranged adjacent to the thickness monitors 210*a* due to the ATM pressure change, $f_2$ is the contribution to thickness difference corresponding to the wafers arranged adjacent to the thickness monitors 210*b* due to the ATM pressure change, and so on.

Therefore, the control parameter changes corresponding to the heating devices 110*a*-110*e* (denoted as ΔControl Parameter 1-ΔControl Parameter 5) are obtained through the calculation above. In some embodiments, an inverse matrix for the 5×6 matrix as shown in the calculation above is used in order to obtain the control parameter changes show in the calculation.

In some embodiments, the control parameter changes and the last control parameters configured to process the last process recipe are then used to generate the new control parameter, according to the formula below:

$$\text{New Control Parameter} = \text{Last Control Parameter} + \Delta\text{Control Parameter}$$

Thus, the controller 160 generates the new control parameters according to the ATM change. Alternatively stated, the controller 160 first generates the control parameter changes according to the factor values, the ATM change, and the thickness differences, and then updates the control parameter according to the control parameter changes.

In some embodiments, in order to process the last process recipe, the controller 160 is configured to send the last control parameter to the temperature controller 180 for forming a first oxidation layer to have a first thickness on the wafers in the process tube 120 under a first ATM pressure. In order to process the acceptable process recipe, the controller 160 is configured to send the new control parameter to the temperature controller 180 for forming a second oxidation layer to have a second thickness on the wafers in the process tube 120 under a second ATM pressure. The difference between the first and second thicknesses equals the thickness difference discussed in previous embodiments, and the difference between the first and second ATM pressures equals the ATM pressure change discussed in previous embodiments.

In some embodiments, when receiving the new control parameters from the controller 160, the temperature controller 180 is configured to adjust the temperatures of the heating device 110*a*-110*e* according to the new control parameters, in order to control the temperature distribution of the process tube 120 and form oxidation layers with the thickness that satisfies the target thickness of the acceptable process recipe.

In some embodiments, by updating the control parameter according to ATM pressure change, the wafer manufacturing system 100 improves the consistency of the manufactured semiconductor devices. For example, the oxidation thicknesses of the same batch of wafers are substantially equal to each other, and thus manufacturing efficiency is improved.

In some embodiments, the controller 160 is further configured to determine whether the ATM pressure change is less than a threshold value. When the ATM pressure change is larger than or equal to the threshold value, the controller 160 is configured to send the new control parameter, associated with the acceptable process recipe, to the temperature controller 180, in order to process the acceptable process recipe. On the other hand, when the ATM pressure change is less than the threshold value, the controller 160 is configured to send one of the control parameters respectively corresponding to the process recipes to the temperature controller 180. Alternatively stated, when the ATM pressure change is less than the threshold value, because the ATM pressure change is small, any of the process recipes can be processed, so the controller 160 sends one of the control parameters corresponding to one of the process recipes to the temperature controller 180, in order to process that process recipe.

In some embodiments, the threshold value is set to be 2.0 kPa. When the ATM pressure change detected by the ATM pressure sensor 140 is less than 2.0 kPa, any of the process recipes, such as the ones shown in Table 1 above, can be processed by the wafer manufacturing system 100. Thus, the controller 160 will select one of the process recipes, update the control parameter according to the ATM pressure change and the selected process recipe, and send the new control parameter to the temperature controller 180. On the other hand, when the ATM pressure change detected by the ATM pressure sensor 140 is larger than or equal to 2.0 kPa, the controller 160 has to first select the acceptable process recipe among the process recipes through calculation discussed in the previous embodiments, and then updates the controller parameter according to the ATM pressure change and the selected acceptable process recipe.

In some approaches, when forming oxidation layers on wafers arranged in a process tube, a wafer manufacturing system does not take the ATM pressure change in the process tube into account and does not select process recipe or update control parameters according to the ATM pressure change. With the configurations of the present disclosure, as mentioned above, the controller 160 selects acceptable process recipe and updates control parameters according to the ATM pressure change, and the stability of the manufactured semiconductor devices is improved. For example, for the process recipes shown in Table 1 above, the stability of thicknesses of oxidation layers are improved by around 6-12%. Accordingly, the disclosed wafer manufacturing system enhances the performance for manufacturing semiconductor devices.

Figure 4:
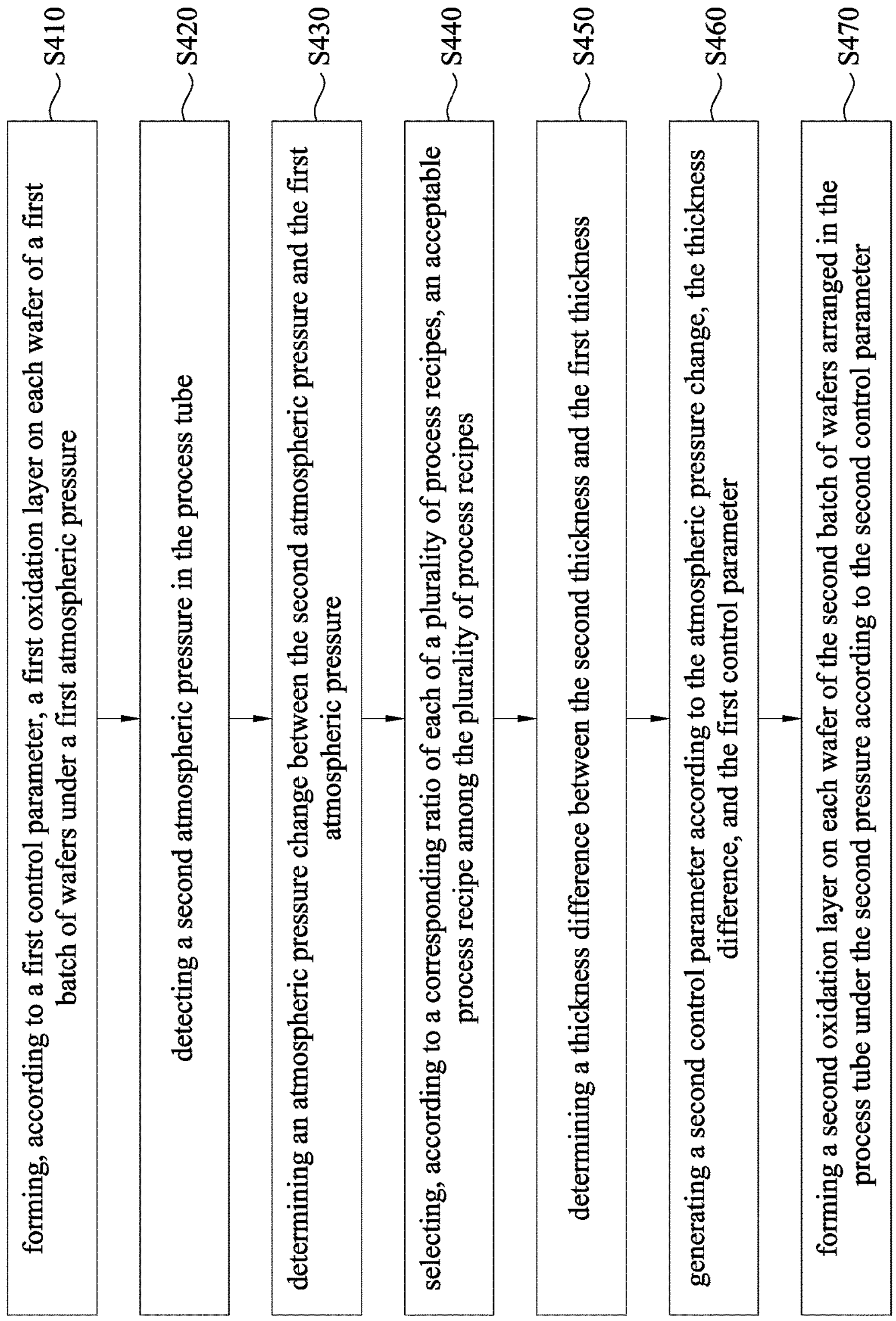
FIG. 4 is a flowchart of a method for manufacturing wafers, in accordance with some embodiments of the present disclosure.

The present disclosure also provides a wafer manufacturing method. Please refer to FIG. 4. FIG. 4 is a flowchart of a method 400 for manufacturing wafers, in accordance with some embodiments of the present disclosure. For illustration, the method 400 includes steps S410-S470.

In some embodiments, the method 400 and its steps are implemented through the wafer manufacturing system 100 illustrated in FIG. 1 and discussed in the previous embodiments. The wafer manufacturing system 100 and its components illustrated in FIG. 1 are used to discuss the steps of the method 400. In addition, details of the previous embodiments can be referred to when understanding the steps of the method 400.

At step S410, the wafer manufacturing system 100 forms, according to a first control parameter, a first oxidation layer on each wafer of a first batch of wafers arranged in the process tube 120 under a first atmospheric pressure, in which the first oxidation layer has a first thickness. Alternatively stated, the wafer manufacturing system 100 forms, according to the last control parameter, oxidation layers on the wafers arranged in the process tube 120 according to the last process recipe under a first atmospheric pressure, as discussed in previous embodiments.

At step S420, when receiving a process request corresponding to a second batch of wafers, the ATM pressure sensor 140 detects a second atmospheric pressure in the process tube 120. Alternatively stated, when the manufacturing system 100 has processed the wafers according to the last process recipe and is about to process the next batch of wafers, the wafer manufacturing system 100 receives a process request, and the ATM pressure sensor 140 detects the ATM pressure in the process tube 120. Because the ATM pressure in the process tube 120 will change according to the outer environment, the newly detected ATM pressure will be different from the ATM pressure detected when the last process recipe was processed.

At step S430, the wafer manufacturing system 100 determines an ATM pressure change between the second ATM pressure and the first ATM pressure. Alternatively stated, because the ATM pressure sensor 140 transmits the ATM pressure to the controller 160, the controller 160 is able to compare the ATM pressures detected at different times. The ATM pressure change is the difference between the ATM pressure detected when the last process recipe was processed and the ATM pressure detected after the wafer manufacturing system 100 receives the request to process the second batch of wafers.

In some embodiments, after step S430, the method 400 includes determining that the ATM pressure change is greater than a threshold value to perform the selecting, according to the corresponding ratio of each of the process recipes, the acceptable process recipe among the process recipes. Alternatively stated, as discussed in previous embodiments, when the controller 160 determines the ATM pressure change is greater than the threshold value, the controller 160 continues step S440 to select the acceptable process recipe among the process recipes. On the other hand, when the controller 160 determines the ATM pressure change is less than the threshold value, because the ATM pressure change is small, any of the process recipes can be processed.

At step S440, the wafer manufacturing system 100 selects, according to a corresponding ratio of each of the process recipes, an acceptable process recipe among the process recipes, in which the corresponding ratio of each of the plurality of process recipes is associated with the ATM pressure change and a corresponding pressure adaptation value of each of the plurality of process recipes, and the acceptable process recipe corresponds to a second thickness. Alternatively stated, as discussed in previous embodiments, the controller 160 selects the acceptable process recipe among multiple process recipes according to the ratio of the ATM pressure change to the product of the pressure adaptation value and the thickness tolerance value.

In some embodiments, step S440 includes determining the pressure adaptation values corresponding to the process recipes according to the target thicknesses and the factor values corresponding to the process recipes, in which the factor values are thickness changes that are associated with the ATM pressure change and correspond to the process recipes. The factor values are thickness changes that are associated with the ATM pressure change and correspond to the process recipes. The pressure adaptation values corresponding to the process recipes can be obtained through the formula discussed in previous embodiments.

In some embodiments, step S440 includes determining the corresponding ratio of each of the process recipes to be a ratio of the ATM pressure change to a product of the corresponding pressure adaptation value and a corresponding thickness tolerance value of each of the process recipes.

At step S450, the wafer manufacturing system 100 determines a thickness difference between the second thickness and the first thickness. Alternatively stated, the controller 160 determines the thickness difference between the last target thickness corresponding to the last process recipe and the target thickness corresponding to the acceptable process recipe.

At step S460, the wafer manufacturing system 100 generates a second control parameter according to the ATM pressure change, the thickness difference, and the first control parameter. In some embodiments, step S460 includes generating the control parameter change according to the ATM pressure change and the thickness difference and generating the second control parameter according to the first control parameter and the control parameter change. In some embodiments, step S460 includes generating the control parameter change according to the factor values, the ATM pressure change and the thickness difference. Alternatively stated, as discussed in the calculation in the previous embodiments, the controller 160 determines the control parameter change according to the ATM pressure change and the thickness difference, and then generates the new control parameter according to the last control parameter and the control parameter change.

At step S470, the wafer manufacturing system 100 forms a second oxidation layer on each wafer of the second batch of wafers arranged in the process tube 120 under the second pressure according to the second control parameter. Alternatively stated, the wafer manufacturing system 100 processes the wafers in the process tube 120 according to the acceptable process recipe and the new control parameter.

Figure 5:
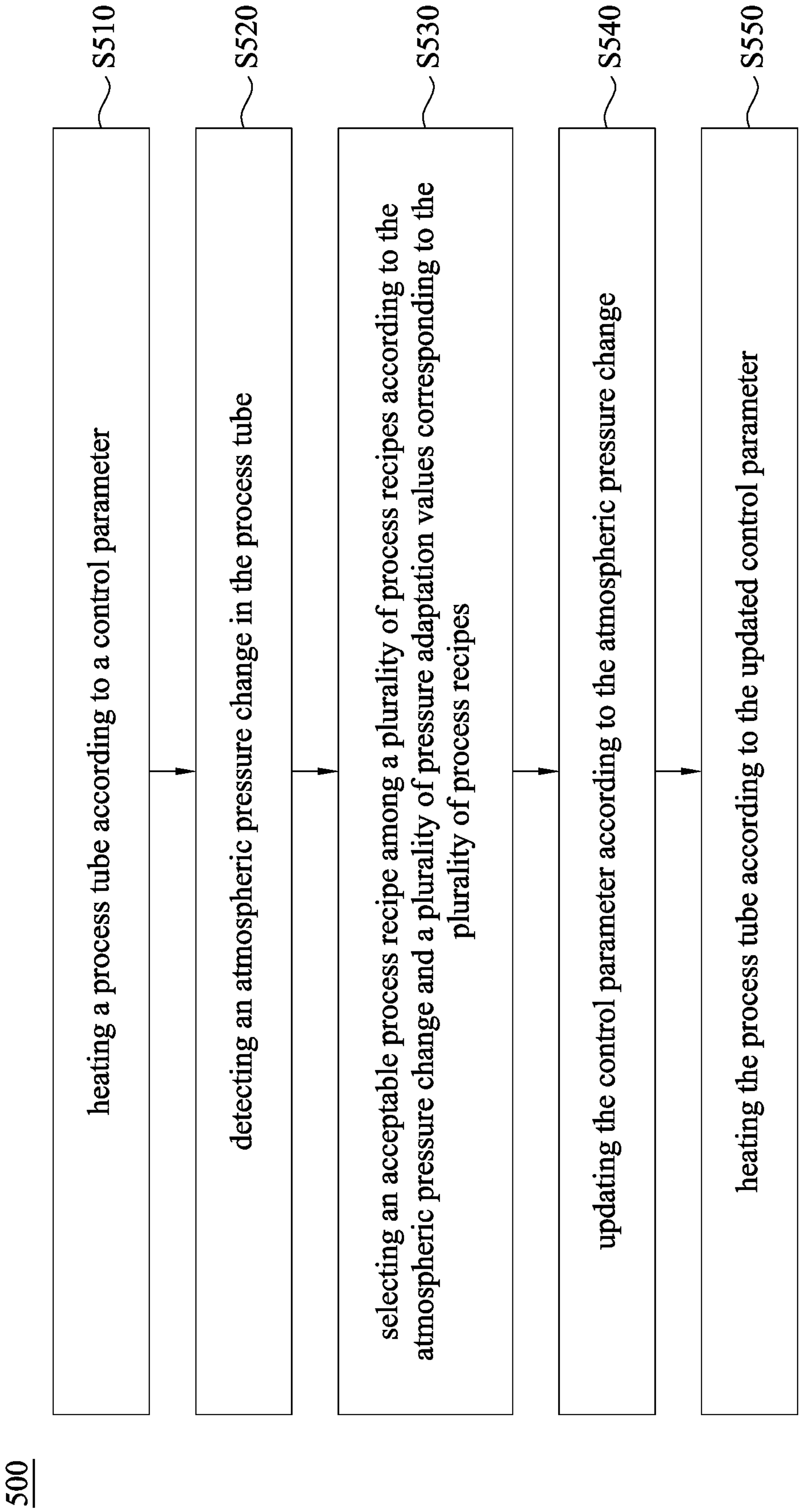
FIG. 5 is a flowchart of a method for manufacturing wafers, in accordance with some embodiments of the present disclosure.

The present disclosure also provides another wafer manufacturing method. Please refer to FIG. 5. FIG. 5 is a flowchart of a method 500 for manufacturing wafers, in accordance with some embodiments of the present disclosure. For illustration, the method 500 includes steps S510-S550.

In some embodiments, the method 500 and its steps are implemented through the wafer manufacturing system 100 illustrated in FIG. 1 and discussed in the previous embodiments. The wafer manufacturing system 100 and its components illustrated in FIG. 1 are used to discuss the steps of the method 500. In addition, details of the previous embodiments can be referred to when understanding the steps of the method 500.

At step S510, the wafer manufacturing system 100 heats the process tube 120 according to a control parameter. Alternatively stated, the heating devices 110*a*-110*e* of the wafer manufacturing system 100 heat the process tube 120 according to the corresponding control parameters, as discussed in previous embodiments.

At step S520, the wafer manufacturing system 100 detects an ATM pressure change in the process tube 120. Alternatively stated, the ATM pressure sensor 140 of the wafer manufacturing system 100 detects the ATM pressure change in the process tube 120, as discussed in previous embodiments.

In some embodiments, before performing step S520, the method 500 further includes forming a first oxidation layer on each wafer of a first batch of wafers arranged in the process tube 120 under a first a pressure, in which the first oxidation layer has a first thickness. Alternatively stated, the wafer manufacturing system 100 processes the last process recipe according to the last control parameter.

At step S530, the wafer manufacturing system 100 selects the acceptable process recipe among the process recipes according to the ATM pressure change and the pressure adaptation values corresponding to the process recipes. The ratio of the ATM pressure change to a corresponding pressure adaptation value of the acceptable process recipe is less than a constant. Relevant details have been discussed in previous embodiments, and previous embodiments can be referred to.

In some embodiments, step S530 includes determining the pressure adaptation values corresponding to the process recipes according to the target thicknesses and the factor values. Relevant details have been discussed in previous embodiments, and previous embodiments can be referred to.

In some embodiments, step S530 includes comparing the ratio of the ATM pressure change to the corresponding pressure adaptation value of the acceptable process recipe with the constant mentioned above. Relevant details have been discussed in previous embodiments, and previous embodiments can be referred to.

At step S540, the wafer manufacturing system 100 updates the control parameter according to the ATM pressure change. Relevant details have been discussed in previous embodiments, and previous embodiments can be referred to.

In some embodiments, step S540 includes generating a control parameter change according to the ATM pressure change and a thickness difference between the second thickness and the first thickness and updating the control parameter according to the control parameter change. Relevant details have been discussed in previous embodiments, and previous embodiments can be referred to.

In some embodiments, generating the control parameter change according to the ATM pressure change and the thickness difference includes generating the control parameter change according to the factor values, the ATM pressure change and the thickness difference. Relevant details have been discussed in previous embodiments, and previous embodiments can be referred to.

At step S550, the wafer manufacturing system 100 heats the process tube 120 according to the updated control parameter. Alternatively stated, after updating the control parameter, the updated control parameter is sent to the temperature controller 180, and the heating devices 110*a*-110*e* heat the process tube 120 according to the updated control parameter.

In some embodiments, after performing step S550, the method 500 further includes forming a second oxidation layer on each wafer of a second batch of wafers arranged in the process tube 120 under a second pressure according to the acceptable process recipe, in which the second oxidation layer has a second thickness different the first thickness. Alternatively stated, the wafer manufacturing system 100 processes the acceptable process recipe according to the updated control parameter.

As described above, the present disclosure provides a wafer manufacturing system and a wafer manufacturing method that are able to adapt different ATM pressure conditions and select acceptable process recipe. Moreover, the system and the method disclosed are also able to take the ATM pressure change into account when updating control parameters associated with the temperature of the process tube. Therefore, the stability regarding the thicknesses of oxidation layers formed on wafers are improved.

In some embodiments, a method for manufacturing wafers is provided, including: forming, according to a first control parameter, a first oxidation layer on each wafer of a first batch of wafers arranged in a process tube under a first atmospheric pressure, in which the first oxidation layer has a first thickness; in response to receiving a process request corresponding to a second batch of wafers: detecting a second atmospheric pressure in the process tube; determining an atmospheric pressure change between the second atmospheric pressure and the first atmospheric pressure; selecting, according to a corresponding ratio of each of multiple process recipes, an acceptable process recipe among the process recipes, in which the corresponding ratio of each of the process recipes is associated with the atmospheric pressure change and a corresponding pressure adaptation value of each of the process recipes, in which the acceptable process recipe corresponds to a second thickness; determining a thickness difference between the second thickness and the first thickness; generating a second control parameter according to the atmospheric pressure change, the thickness difference, and the first control parameter; and forming a second oxidation layer on each wafer of the second batch of wafers arranged in the process tube under the second pressure according to the second control parameter.

In some embodiments, selecting, according to the corresponding ratio of each of the process recipes, the acceptable process recipe among the process recipes includes: determining the pressure adaptation values corresponding to the process recipes according to multiple target thicknesses and multiple factor values, in which the factor values are thickness changes that are associated with the atmospheric pressure change and correspond to the process recipes.

In some embodiments, selecting, according to the corresponding ratio of each of the process recipes, the acceptable process recipe among the process recipes includes: determining the corresponding ratio of each of the process recipes to be a ratio of the atmospheric pressure change to a product of the corresponding pressure adaptation value and a corresponding thickness tolerance value of each of the process recipes.

In some embodiments, generating the second control parameter according to the atmospheric pressure change, the thickness difference, and the first control parameter includes: generating a control parameter change according to the atmospheric pressure change and the thickness difference; and generating the second control parameter according to the first control parameter and the control parameter change.

In some embodiments, generating the control parameter change according to the atmospheric pressure change and the thickness difference includes: generating the control parameter change according to multiple factor values, the atmospheric pressure change and the thickness difference, in which the factor values are thickness changes that are associated with the atmospheric pressure change and correspond to the process recipes.

In some embodiments, the method further includes: after determining the atmospheric pressure change, determining that the atmospheric pressure change is greater than a threshold value to perform the selecting, according to the corresponding ratio of each of the process recipes, the acceptable process recipe among the process recipes.

In some embodiments, a method for manufacturing wafers is provided, including: heating a process tube according to a control parameter; detecting an atmospheric pressure change in the process tube; selecting an acceptable process recipe among multiple process recipes according to the atmospheric pressure change and multiple pressure adaptation values corresponding to the process recipes, in which a ratio of the atmospheric pressure change to a corresponding pressure adaptation value of the acceptable process recipe is less than a constant; updating the control parameter according to the atmospheric pressure change; and heating the process tube according to the updated control parameter.

In some embodiments, selecting the acceptable process recipe among the process recipes according to the atmospheric pressure change and the pressure adaptation values includes: determining the pressure adaptation values corresponding to the process recipes according to multiple target thicknesses and multiple factor values, in which the factor values are thickness changes that are associated with the atmospheric pressure change and correspond to the process recipes.

In some embodiments, selecting the acceptable process recipe among the process recipes according to the atmospheric pressure change and the pressure adaptation values includes: comparing the ratio of the atmospheric pressure change to the corresponding pressure adaptation value of the acceptable process recipe with the constant.

In some embodiments, the method further includes: before detecting the atmospheric pressure change in the process tube, forming a first oxidation layer on each wafer of a first batch of wafers arranged in the process tube under a first a pressure, in which the first oxidation layer has a first thickness; and after heating the process tube according to the updated control parameter, forming a second oxidation layer on each wafer of a second batch of wafers arranged in the process tube under a second pressure according to the acceptable process recipe, in which the second oxidation layer has a second thickness different the first thickness.

In some embodiments, updating the control parameter according to the atmospheric pressure change includes: generating a control parameter change according to the atmospheric pressure change and a thickness difference between the second thickness and the first thickness; and updating the control parameter according to the control parameter change.

In some embodiments, generating the control parameter change according to the atmospheric pressure change and the thickness difference includes: generating the control parameter change according to multiple factor values, the atmospheric pressure change and the thickness difference, in which the factor values are thickness changes that are associated with the atmospheric pressure change and correspond to the process recipes.

In some embodiments, the method further includes before selecting the acceptable process recipe among the process recipes according to the atmospheric pressure change and the pressure adaptation values, determining whether the atmospheric pressure change is less than a threshold value.

In some embodiments, a wafer manufacturing system is provided, including a process tube, at least one heating device, a temperature controller, an atmospheric pressure sensor, and a controller. The at least one heating device is configured to heat the process tube to a temperature. The temperature controller is electrically connected to the at least one heating device and configured to control, according to multiple control parameters, the temperature of the process tube through the at least one heating device. The atmospheric pressure sensor is connected to the process tube and configured to detect an atmospheric pressure change in the process tube. The controller is electrically connected to the atmospheric pressure sensor and the temperature controller. The controller is configured to select an acceptable process recipe among multiple process recipes according to the atmospheric pressure change and multiple pressure adaptation values corresponding to the process recipes, and configured to generate a first control parameter of the control parameters, according to the atmospheric pressure change. A ratio of the atmospheric pressure change to a corresponding pressure adaptation value of the acceptable process recipe is less than a constant.

In some embodiments, the controller is further configured to determine the pressure adaptation values corresponding to the process recipes according to multiple target thicknesses and multiple factor values, in which the factor values are thickness changes that are associated with the atmospheric pressure change and correspond to the process recipes.

In some embodiments, the controller is further configured to select the acceptable process recipe among the process recipes according to the atmospheric pressure change and the pressure adaptation values and multiple thickness tolerance values corresponding to the process recipes.

In some embodiments, the controller is further configured to send a second control parameter of the control parameters to the temperature controller for forming a first oxidation layer to have a first thickness on a wafer in the process tube under a first atmospheric pressure and send the first control parameter of the control parameters to the temperature controller for forming a second oxidation layer to have a second thickness on the wafer in the process tube under a second atmospheric pressure. A thickness difference exists between the second thickness and the first thickness.

In some embodiments, the controller is further configured to generate a control parameter change according to the atmospheric pressure change and the thickness difference and update the control parameter according to the control parameter change.

In some embodiments, the controller is further configured to generate the control parameter change according to multiple factor values, the atmospheric pressure change and the thickness difference. The factor values are thickness changes that are associated with the atmospheric pressure change and correspond to the process recipes.

In some embodiments, the controller is further configured to determine whether the atmospheric pressure change is less than a threshold value. In response to the atmospheric pressure change being larger than or equal to the threshold value, the controller is further configured to send the first control parameter, associated with the acceptable process recipe, to the temperature controller. In response to the atmospheric pressure change being less than the threshold value, the controller is further configured to send one of the control parameters to the temperature controller.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method for manufacturing wafers, comprising:

forming, according to a first control parameter, a first oxidation layer on each wafer of a first batch of wafers arranged in a process tube under a first atmospheric pressure, wherein the first oxidation layer has a first thickness;

in response to receiving a process request corresponding to a second batch of wafers:

detecting a second atmospheric pressure in the process tube;

determining an atmospheric pressure change between the second atmospheric pressure and the first atmospheric pressure;

selecting, according to a corresponding ratio of each of a plurality of process recipes, an acceptable process recipe among the plurality of process recipes, wherein the corresponding ratio of each of the plurality of process recipes is associated with the atmospheric pressure change and a corresponding pressure adaptation value of each of the plurality of process recipes, wherein the acceptable process recipe corresponds to a second thickness;

determining a thickness difference between the second thickness and the first thickness;

generating a second control parameter according to the atmospheric pressure change, the thickness difference, and the first control parameter; and forming a second oxidation layer on each wafer of the second batch of wafers arranged in the process tube under the second atmospheric pressure according to the second control parameter, wherein the process tube is surrounded by a resistive coil, wherein a first part of the resistive coil connected to a first heating device is larger than a second part of the resistive coil connected to a second heating device.

2. The method of claim 1, wherein selecting, according to the corresponding ratio of each of the plurality of process recipes, the acceptable process recipe among the plurality of process recipes comprises:

determining a plurality of pressure adaptation values corresponding to the plurality of process recipes according to a plurality of target thicknesses and a plurality of factor values, wherein the plurality of factor values are thickness changes that are associated with the atmospheric pressure change and correspond to the plurality of process recipes.

3. The method of claim 1, wherein selecting, according to the corresponding ratio of each of the plurality of process recipes, the acceptable process recipe among the plurality of process recipes comprises:

determining the corresponding ratio of each of the plurality of process recipes to be a ratio of the atmospheric pressure change to a product of the corresponding pressure adaptation value and a corresponding thickness tolerance value of each of the plurality of process recipes.

4. The method of claim 1, wherein generating the second control parameter according to the atmospheric pressure change, the thickness difference, and the first control parameter comprises:

generating a control parameter change according to the atmospheric pressure change and the thickness difference; and generating the second control parameter according to the first control parameter and the control parameter change.

5. The method of claim 4, wherein generating the control parameter change according to the atmospheric pressure change and the thickness difference comprises:

generating the control parameter change according to a plurality of factor values, the atmospheric pressure change and the thickness difference, wherein the plurality of factor values are thickness changes that are associated with the atmospheric pressure change and correspond to the plurality of process recipes;

wherein the first oxidation layer and the second oxidation layer are gate oxide layers, each of which is arranged between a gate and a substrate.

6. The method of claim 1, further comprising:

after determining the atmospheric pressure change, determining that the atmospheric pressure change is greater than a threshold value to perform the selecting, according to the corresponding ratio of each of the plurality of process recipes, the acceptable process recipe among the plurality of process recipes.

7. A method for manufacturing wafers, comprising:

heating a process tube according to a control parameter;

detecting an atmospheric pressure change in the process tube;

selecting an acceptable process recipe among a plurality of process recipes according to the atmospheric pressure change and a plurality of pressure adaptation values corresponding to the plurality of process recipes, wherein a ratio of the atmospheric pressure change to a corresponding pressure adaptation value of the acceptable process recipe is less than a constant value;

updating the control parameter according to the atmospheric pressure change; and heating the process tube according to a updated control parameter, wherein the process tube is surrounded by a resistive coil, wherein a first part of the resistive coil connected to a first heating device is larger than a second part of the resistive coil connected to a second heating device.

8. The method of claim 7, wherein selecting the acceptable process recipe among the plurality of process recipes according to the atmospheric pressure change and the plurality of pressure adaptation values comprises:

determining the plurality of pressure adaptation values corresponding to the plurality of process recipes according to a plurality of target thicknesses and a plurality of factor values, wherein the plurality of factor values are thickness changes that are associated with the atmospheric pressure change and correspond to the plurality of process recipes.

9. The method of claim 7, wherein selecting the acceptable process recipe among the plurality of process recipes according to the atmospheric pressure change and the plurality of pressure adaptation values comprises:

comparing the ratio of the atmospheric pressure change to the corresponding pressure adaptation value of the acceptable process recipe with the constant value.

10. The method of claim 7, further comprising:

before detecting the atmospheric pressure change in the process tube, forming a first oxidation layer on each wafer of a first batch of wafers arranged in the process tube under a first a pressure, wherein the first oxidation layer has a first thickness; and after heating the process tube according to the updated control parameter, forming a second oxidation layer on each wafer of a second batch of wafers arranged in the process tube under a second pressure according to the acceptable process recipe, wherein the second oxidation layer has a second thickness different the first thickness.

11. The method of claim 10, wherein updating the control parameter according to the atmospheric pressure change comprises:

generating a control parameter change according to the atmospheric pressure change and a thickness difference between the second thickness and the first thickness; and updating the control parameter according to the control parameter change.

12. The method of claim 11, wherein generating the control parameter change according to the atmospheric pressure change and the thickness difference comprises:

generating the control parameter change according to a plurality of factor values, the atmospheric pressure change and the thickness difference, wherein the plurality of factor values are thickness changes that are associated with the atmospheric pressure change and correspond to the plurality of process recipes;

wherein the first oxidation layer and the second oxidation layer are gate oxide layers, each of which is arranged between a gate and a substrate.

13. The method of claim 7, further comprising:

before selecting the acceptable process recipe among the plurality of process recipes according to the atmospheric pressure change and the plurality of pressure adaptation values, determining whether the atmospheric pressure change is less than a threshold value.

14. A wafer manufacturing system, comprising:

a process tube;

a plurality of heating devices configured to heat the process tube to a temperature;

a temperature controller, electrically connected to the plurality of heating devices and configured to control, according to a plurality of control parameters, the temperature of the process tube through the plurality of heating devices;

an atmospheric pressure sensor, connected to the process tube and configured to detect an atmospheric pressure change in the process tube; and a controller, electrically connected to the atmospheric pressure sensor and the temperature controller;

wherein the controller is configured to select an acceptable process recipe among a plurality of process recipes according to the atmospheric pressure change and a plurality of pressure adaptation values corresponding to the plurality of process recipes, and configured to generate a first control parameter of the plurality of control parameters, according to the atmospheric pressure change;

wherein a ratio of the atmospheric pressure change to a corresponding pressure adaptation value of the acceptable process recipe is less than a constant value, wherein the process tube is surrounded by a resistive coil, wherein a first part of the resistive coil connected to a first heating device of the plurality of heating devices is larger than a second part of the resistive coil connected to a second heating device of the plurality of heating devices.

15. The wafer manufacturing system of claim 14, wherein the controller is further configured to:

determine the plurality of pressure adaptation values corresponding to the plurality of process recipes according to a plurality of target thicknesses and a plurality of factor values, wherein the plurality of factor values are thickness changes that are associated with the atmospheric pressure change and correspond to the plurality of process recipes.

16. The wafer manufacturing system of claim 14, wherein the controller is further configured to:

select the acceptable process recipe among the plurality of process recipes according to the atmospheric pressure change and the plurality of pressure adaptation values and a plurality of thickness tolerance values corresponding to the plurality of process recipes.

17. The wafer manufacturing system of claim 14, wherein the controller is further configured to:

send a second control parameter of the plurality of control parameters to the temperature controller for forming a first oxidation layer to have a first thickness on a wafer in the process tube under a first atmospheric pressure; and send the first control parameter of the plurality of control parameters to the temperature controller for forming a second oxidation layer to have a second thickness on the wafer in the process tube under a second atmospheric pressure;

wherein the first thickness and the second thickness are different from each other by a thickness difference.

18. The wafer manufacturing system of claim 17, wherein the controller is further configured to:

generate a control parameter change according to the atmospheric pressure change and the thickness difference; and update the control parameter according to the control parameter change.

19. The wafer manufacturing system of claim 18, wherein the controller is further configured to:

generate the control parameter change according to a plurality of factor values, the atmospheric pressure change and the thickness difference, wherein the plurality of factor values are thickness changes that are associated with the atmospheric pressure change and correspond to the plurality of process recipes.

20. The wafer manufacturing system of claim 14, wherein:

the controller is further configured to determine whether the atmospheric pressure change is less than a threshold value;

in response to the atmospheric pressure change being larger than or equal to the threshold value, the controller is further configured to send the first control parameter, associated with the acceptable process recipe, to the temperature controller; and in response to the atmospheric pressure change being less than the threshold value, the controller is further configured to send one of the plurality of control parameters to the temperature controller.

* * * * *